United States Patent
Mima

(10) Patent No.: US 8,624,486 B2
(45) Date of Patent: Jan. 7, 2014

(54) LIGHT-EMITTING DEVICE HAVING ORGANIC ELEMENTS CONNECTED IN SERIES

(75) Inventor: Shoji Mima, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 224 days.

(21) Appl. No.: 13/322,397

(22) PCT Filed: May 20, 2010

(86) PCT No.: PCT/JP2010/058949
§ 371 (c)(1),
(2), (4) Date: Nov. 23, 2011

(87) PCT Pub. No.: WO2010/137633
PCT Pub. Date: Dec. 2, 2010

(65) Prior Publication Data
US 2012/0062108 A1 Mar. 15, 2012

(30) Foreign Application Priority Data
May 27, 2009 (JP) ................................. 2009-127498

(51) Int. Cl.
*H01L 27/32* (2006.01)
(52) U.S. Cl.
USPC ............................. 313/504; 313/505; 427/66
(58) Field of Classification Search
USPC ............ 313/504, 505, 506, 512; 257/98–100
See application file for complete search history.

(56) References Cited

U.S. PATENT DOCUMENTS

| 6,107,734 | A | 8/2000 | Tanaka et al. |
| 7,049,757 | B2 | 5/2006 | Foust et al. |
| 8,283,849 | B2 * | 10/2012 | Hente et al. ................... 313/503 |
| 2004/0021425 | A1 | 2/2004 | Foust et al. |
| 2004/0031957 | A1 | 2/2004 | Tyan |
| 2004/0032220 | A1 | 2/2004 | Cok et al. |
| 2007/0200489 | A1 | 8/2007 | Poon et al. |
| 2008/0224606 | A1 * | 9/2008 | Kawai et al. ................... 313/504 |
| 2009/0272991 | A1 * | 11/2009 | Lee et al. ......................... 257/91 |

FOREIGN PATENT DOCUMENTS

| JP | 11-329748 A | 11/1999 |
| JP | 2000-029404 A | 1/2000 |
| JP | 2004-071570 A | 3/2004 |
| JP | 2004-134359 A | 4/2004 |
| JP | 2004-134385 A | 4/2004 |
| JP | 2006-049853 A | 2/2006 |
| JP | 2007-257855 A | 10/2007 |
| WO | WO 2007/089406 A2 | 8/2007 |

* cited by examiner

*Primary Examiner* — Karabi Guharay
(74) *Attorney, Agent, or Firm* — Sughrue Mion, PLLC

(57) ABSTRACT

The present invention provides a light-emitting device comprising a supporting substrate and a plurality of organic EL elements provided on the supporting substrate to be connected in series, in which each of the organic EL elements comprises a pair of electrodes and a light-emitting layer placed between the electrodes, the light-emitting layer extends in the prescribed array direction across the plurality of organic EL elements, each electrode out of the pair of electrodes comprises an extended portion that extends, as viewed from one thickness direction of the supporting substrate, protruding from the light-emitting layer in a width direction vertical to both of the thickness direction of the supporting substrate and the array direction, and one electrode out of the pair of electrodes further comprises a connecting portion that extends from the extended portion in the array direction to the other electrode of the organic EL element neighboring in the array direction so as to be connected to the other electrode.

7 Claims, 10 Drawing Sheets

WIDTH DIRECTION Y
ARRAY DIRECTION X

ARRAY DIRECTION X
THICKNESS DIRECTION Z (1)

WIDTH DIRECTION Y ↕   ARRAY DIRECTION X ↔

(2)

ARRAY DIRECTION X ↔   THICKNESS DIRECTION Z ↕

(1)

WIDTH DIRECTION Y ↕   ARRAY DIRECTION X ↔

(2)

ARRAY DIRECTION X ↔   THICKNESS DIRECTION Z ↕

(1)

WIDTH DIRECTION Y  ARRAY DIRECTION X (2)

ARRAY DIRECTION X   THICKNESS DIRECTION Z

ARRAY
DIRECTION X (1)

(2)

(3)

(4)

ARRAY DIRECTION X

LIGHT-EMITTING DEVICE HAVING ORGANIC ELEMENTS CONNECTED IN SERIES

CROSS REFERENCE TO RELATED APPLICATION

This application is a National Stage of International Application No. PCT/JP2010/058949, filed on May 20, 2010, claiming priority based on Japanese Patent Application No. 2009-127498, filed May 27, 2009, the contents of all of which are incorporated herein by reference in their entirety.

TECHNICAL FIELD

The present invention relates to a light-emitting device and a method for manufacturing thereof.

BACKGROUND ART

An organic electroluminescent element (hereinafter, "electroluminescent" is also referred to as "EL") is a light-emitting element that comprises a light-emitting layer comprises an organic substance as a light-emitting material, and comprises a pair of electrodes (an anode and a cathode) and the light-emitting layer placed between the electrodes. When voltage is applied to the organic EL element, holes are injected from the anode and electrons are injected from the cathode. The holes and electrons are recombined in the light-emitting layer to emit light.

Studies have been conducted on, for example, an illuminating device that comprises a light-emitting device comprising the organic EL element as a light source. By enlarging the area of each of the layers such as the electrode and the light-emitting layer that constitute the organic EL element, the organic EL element can emit light at a large area and then improve lightness. However, enlarging the area of the element increases a voltage drop at the electrode in operation, which may make the center of the element relatively darker. Thus, enlarging the area of the element may result in apparent nonuniformity in brightness. Under the circumstances, in order to secure a certain level of lightness while inhibiting nonuniformity in brightness, an illuminating device comprising a plurality of organic EL elements the areas of which are enlarged but still enough small to make nonuniformity in brightness invisible to a user has been suggested (see JP 2007-257855 A, for example).

FIG. 9 is a schematic of a light-emitting device 2 in which a plurality of (three in FIG. 9) organic EL elements 1 are connected in series. FIG. 9(1) is a plan view of the light-emitting device 2 and FIG. 9(2) is a cross-sectional view of the light-emitting device 2. The plurality of organic EL elements 1 are usually provided on a supporting substrate 3 on which a driving circuit is formed to drive the organic EL elements 1.

The light-emitting device 2 illustrated in FIG. 9 comprises three organic EL elements 1. These three organic EL elements 1 are arranged on the supporting substrate 3 in a prescribed array direction X to be connected in series. As described above, each organic EL element 1 comprises a pair of electrodes 4 and 5 and a light-emitting layer 6 placed between the electrodes. Hereinafter, one electrode out of the pair of electrodes 4 and 5 that is closer to the supporting substrate 3 is described as a first electrode 4, and the other electrode that is farther from the supporting substrate 3 than the first electrode 4 is described as a second electrode 5. One of the first and second electrodes 4 and 5 works as an anode and the other electrode works as a cathode. Between the first and second electrodes 4 and 5, a prescribed layer that is different from the light-emitting layer 6 may be placed in addition to the light-emitting layer 6 in consideration of element characteristics, easiness of processes, and the like.

As illustrated in FIG. 9, the first electrodes 4 of the organic EL elements 1 are discretely arranged to be spaced at prescribed intervals in the array direction X and therefore they are not in physical connection with each other. In the same manner, the second electrodes 5 of the organic EL elements 1 are discretely arranged to be spaced at prescribed intervals in the array direction X and therefore they are not in physical connection with each other. Thus, there is no physical connection between the first electrodes 4 and between the second electrodes 5.

On the other hand, the second electrode 5 is physically connected to the first electrode 4 of the organic EL element 1 neighboring in the array direction X. Thus, the organic EL elements 1 are connected in series. Specifically, the first electrode 4 is formed so that one end (hereinafter, also referred to as the left end) in one array direction X (hereinafter, "one array direction X" is also referred to as "left" and "the other array direction X" is also referred to as right) of the first electrode 4 extends to overlap the right-side end (hereinafter, also referred to as the right end) of the second electrode 5 of the organic EL element 1 neighboring to the left, and therefore it is physically connected to the first electrode 4 of the organic EL element 1 neighboring to the left. Thus, the second electrode 5 is physically connected to the first electrode 4 of the organic EL element 1 neighboring in the array direction X to constitute a series connection of the organic EL elements 1.

DISCLOSURE OF INVENTION

In the case of forming the light-emitting layer 6 using a low molecular compound as an organic substance, the light-emitting layer 6 is usually formed by a vapor deposition method. The vapor deposition method achieves pattern formation of layers relatively easily and therefore, for example, can achieve selective pattern formation of the light-emitting layer 6 only on the first electrode 4.

On the other hand, the inventors of the present invention have conducted studies on forming a light-emitting layer by a coating method in view of easiness of processes. Specifically, they studied on applying an ink comprising a material of the light-emitting layer 6 by a prescribed coating method to form a film and then solidifying the film to form the light-emitting layer 6.

A step of forming the organic EL elements 1 in series illustrated in FIG. 9 by a coating method will be described below referring to FIG. 10. FIG. 10 is a schematic cross-sectional view of the step of forming the organic EL elements 1 illustrated in FIG. 9.

First, three first electrodes 4 are discretely formed on the supporting substrate 3 to be spaced at prescribed intervals in the array direction X (see FIG. 10(1)). For example, a conductive thin film can be formed by a sputtering method, followed by patterning by photolithography to discretely form the first electrode 4. Next, the ink comprising a material of the light-emitting layer 6 is applied on the supporting substrate 3 by the prescribed coating method (see FIG. 10(2)). Generally by a coating method, selective pattern application of an ink only on a desired area is difficult to achieve and the ink is applied even on an unneeded area such as areas between the first electrodes 4 and on the left end of the first electrode 4. Therefore, after applying the ink, a step of removing the ink applied on the unneeded area is required (see FIG. 10(3)). Ink removal can be performed using, for example, a waste, a cotton swab, or the like impregnated with a solvent to which the ink is soluble to strip the ink applied on the unneeded area. Then, the film formed after application is solidified by heating or the like to form the light-emitting layer 6. Subsequently, patterning the second electrode 5 is performed by, for example, a vapor deposition method (see FIG. 10(4)). The second electrode 5 is formed to reach and overlap the left end of the first electrode 4 of the organic EL element 1 on the right. Thus, the organic EL elements 1 in series are formed.

As described above, in the case of forming the light-emitting layer 6 in the method illustrated in FIG. 10 by a coating method, the step of removing the ink that is once applied is required, resulting in an increase of the number of steps. Since the light-emitting layer 6 usually deteriorates as exposed to atmosphere, in the step of forming the organic EL element 1, duration of the light-emitting layer 6 being exposed to atmosphere is preferably short and, after applying the ink, the electrode or the like for covering the light-emitting layer is needed to be formed as soon as possible. However, in the method illustrated in FIG. 10, the step of removing the ink is required and duration of the light-emitting layer 6 being exposed to atmosphere is long, which may lead to deterioration of the light-emitting layer 6.

The first electrode 4 is formed by a method that can form a fine pattern, such as photolithography or mask vapor deposition, so that the clearances between the neighboring first electrodes 4 can be extremely small. However, in the method that comprises the step of removing the ink once applied, it is generally difficult to strip the applied film by an extremely small width as of the clearances between the neighboring first electrodes 4. Because of this, even when the first electrodes 4 are formed with the extremely small clearances between neighboring electrodes, the ink is to be removed by a width larger than the clearances between the first electrodes 4, and therefore the step of removing the ink leads to limitation of a light-emitting region.

A purpose of the present invention is to provide a light-emitting device comprising a series connection of organic EL elements with large light-emitting areas, the light-emitting layer of the device can be formed by a coating method in which a step of wiping a prescribed ink off can be omitted.

The present invention provides the following light-emitting device and a method for manufacturing thereof.

[1] A light-emitting device, comprising:
a supporting substrate; and
a plurality of organic electroluminescent elements provided on the supporting substrate in a prescribed array direction to be connected in series, wherein
each of the organic electroluminescent elements comprises a pair of electrodes and a light-emitting layer placed between the electrodes,
the light-emitting layer extends in the prescribed array direction across the plurality of organic electroluminescent elements,
each electrode out of the pair of electrodes comprises an extended portion that extends, as viewed from one thickness direction of the supporting substrate, protruding from the light-emitting layer in a width direction vertical to both of the thickness direction of the supporting substrate and the array direction, and
one electrode out of the pair of electrodes further comprises a connecting portion that extends from the extended portion in the array direction to the other electrode of the organic electroluminescent element neighboring in the array direction so as to be connected to the other electrode.

[2] The light-emitting device according to claim 1, further comprising an auxiliary electrode in contact with the electrode, wherein
the auxiliary electrode has sheet resistance that is lower than that of the electrode in contact with the auxiliary electrode.

[3] The light-emitting device according to claim 2, wherein the auxiliary electrode is provided in contact with one electrode out of the pair of electrodes that has higher sheet resistance.

[4] The light-emitting device according to any one of claims 1 to 3, wherein only one electrode out of the pair of electrodes that has lower sheet resistance comprises the connecting portion.

[5] The light-emitting device according to any one of claims 1 to 4, wherein the extended portion, as viewed from one thickness direction, comprises a first extended portion that extends protruding from the light-emitting layer in one width direction and a second extended portion that extends protruding from the light-emitting layer in the other width direction.

[6] A method for manufacturing a light-emitting device, wherein the light-emitting device comprises a supporting substrate and a plurality of organic electroluminescent elements provided on the supporting substrate in a prescribed array direction to be connected in series,
each of the organic electroluminescent elements comprises a pair of electrodes and a light-emitting layer placed between the electrodes,
the light-emitting layer extends in the prescribed array direction across the plurality of organic electroluminescent elements,
each electrode out of the pair of electrodes comprises an extended portion that extends, as viewed from one thickness direction of the supporting substrate, protruding from the light-emitting layer in a width direction vertical to both of the thickness direction of the supporting substrate and the array direction, and
one electrode out of the pair of electrodes further comprises a connecting portion that extends from the extended portion in the array direction to the other electrode of the organic electroluminescent element neighboring in the array direction so as to be connected to the other electrode,
the method comprising:
continuously applying an ink comprising a material of the light-emitting layer in the prescribed array direction across the organic electroluminescent elements and solidifying the applied film thereby forming the light-emitting layer.

[7] The method for manufacturing a light-emitting device according to claim 6, wherein a method of ink application is a CAP coating method, a slit coating method, a spray coating method, or a printing method.

Figure 1:
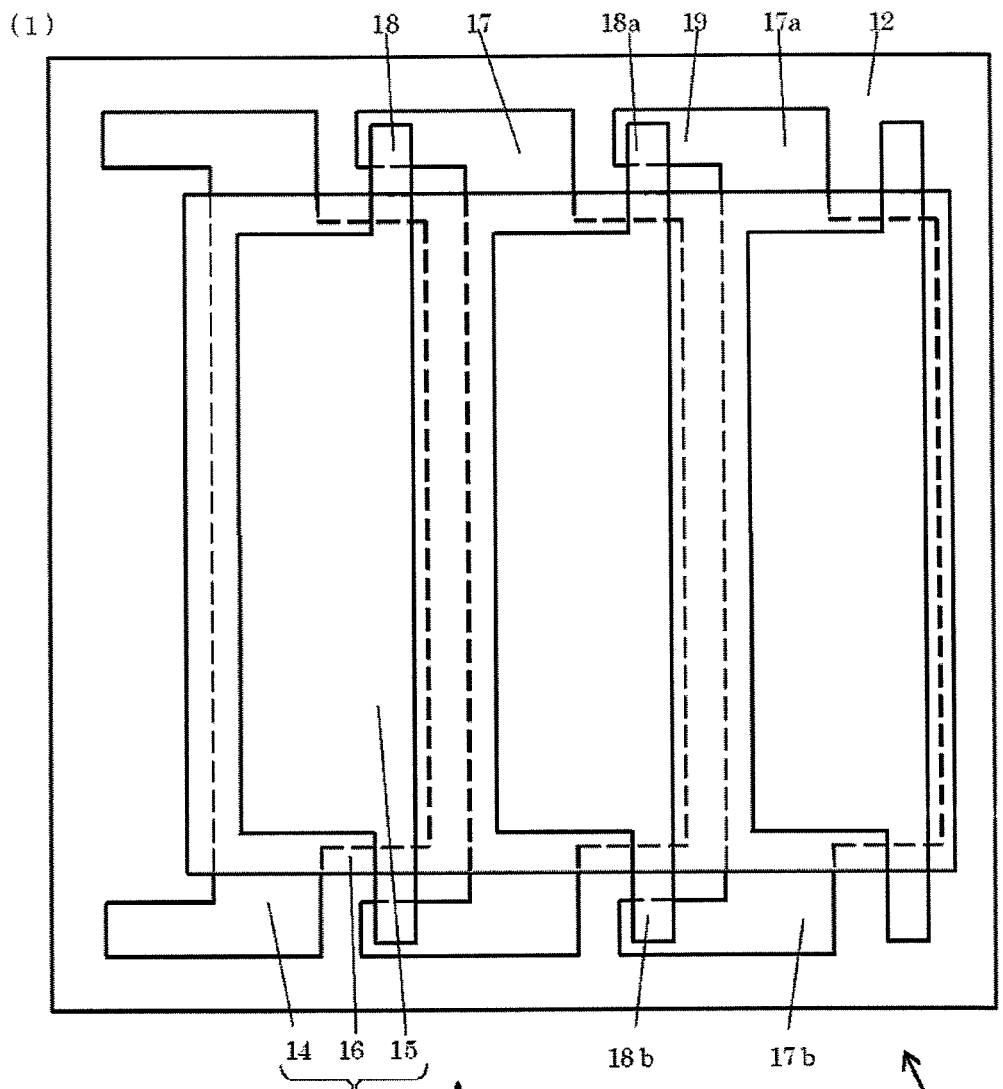
FIG. 1 is a plan view of a light-emitting device 11 of a first embodiment of the present invention.
Figure 1:
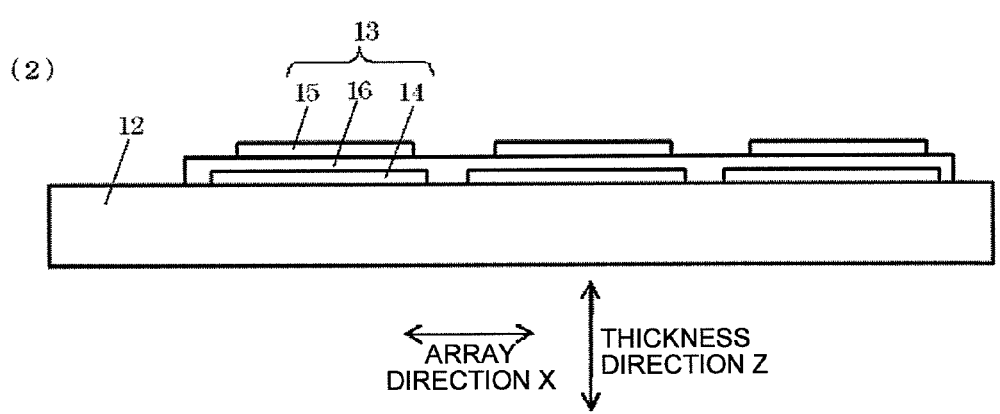

EXPLANATIONS OF LETTERS OR NUMERALS 1 organic EL element
2 light-emitting device
3 supporting substrate
4 first electrode
5 second electrode
6 light-emitting layer
11 light-emitting device
12 supporting substrate
13 organic EL element
14 first electrode
15 second electrode
16 light-emitting layer
17, 18 extended portion
19 connecting portion
21 CAP Coater system
22 table
23 nozzle
24 tank
25 slit
26 ink supply tube
27 ink
28 liquid level sensor
29 subject
31 light-emitting device
32 connecting portion
41 light-emitting device
42 connecting portion
51 light-emitting device
52 auxiliary electrode
61 light-emitting device

DESCRIPTION OF EMBODIMENTS

1) Structure of Light-Emitting Device

The structure of a light-emitting device will be described below referring to drawings. A light-emitting device of a present embodiment may be used in a light source of, for example, an illuminating device, a liquid crystal display device, or a scanner. FIG. 1 is a plan view of a light-emitting device 11 of a first embodiment of the present invention. The light-emitting device 11 comprises a supporting substrate 12 and a plurality of organic EL elements 13 provided on the supporting substrate 12 in a prescribed array direction X to be connected in series. The prescribed array direction X is defined to be a direction vertical to the thickness direction Z of the supporting substrate 12.

In other words, the array direction X is defined to be parallel to the principal surface of the supporting substrate 12. In the present embodiment, the plurality of organic EL elements 13 are arranged along a prescribed straight line as illustrated in FIG. 1, while they may be arranged along a prescribed curve. In the case where the organic EL elements 13 are arranged along the prescribed curve, the array direction X corresponds to a tangential direction of the prescribed curve.

The number of the organic EL elements 13 to be provided on the supporting substrate 12 is designed as appropriate depending on the design.

In a first embodiment below, the light-emitting device 11 comprising three organic EL elements 13 will be described.

Each organic EL element 13 comprises a pair of electrodes 14 and 15 and a light-emitting layer 16 placed between the electrodes 14 and 15. One electrode out of the pair of electrodes 14 and 15 works as the anode of the organic EL element 13 and the other electrode works as the cathode of the organic EL element 13. Hereinafter, the electrode out of the pair of electrodes 14 and 15 that is closer to the supporting substrate 12 is also referred to as a first electrode 14, and the other electrode that is farther from the supporting substrate 12 than the first electrode 14 is also referred to as a second electrode 15.

Between the first and second electrodes 14 and 15, one or more prescribed layers are placed. Between the first and second electrodes 14 and 15, at least the light-emitting layer 16 is placed as the one or more prescribed layers.

The light-emitting layer 16 extends in the array direction X across the organic EL elements 13. In the present embodiment, as for the organic EL elements 13 in series, a continuous light-emitting layer is formed in an integrated fashion extending in the array direction X from the light-emitting layer 16 of the organic EL element 13 provided on one end (the left end in FIG. 1) of the array direction X to the light-emitting layer 16 of the organic EL element 13 provided on the other end (the right end in FIG. 1) of the array direction X. In the case where a prescribed layer that is different from the light-emitting layer is placed between the first and second electrodes 14 and 15, the prescribed layer may extend in the array direction X across the organic EL elements 13 or may be formed separately for each organic EL element 13 with spaces in between. In the case where the prescribed layer that is different from the light-emitting layer is formed by a coating method, the prescribed layer that is different from the light-emitting layer preferably extends in the array direction X across the organic EL elements 13, as in the case of the light-emitting layer.

The first and second electrodes 14 and 15 (the pair of electrodes) comprise extended portions 17 and 18, respectively, that extend, as viewed from one thickness direction Z (hereinafter, also referred to as "in a planar view") of the supporting substrate 12, protruding from the light-emitting layer 16 in a width direction Y vertical to both of the thickness direction Z of the supporting substrate and the array direction X. The extended portion 17 of the first electrode 14 is formed within the first electrode 14 as a part of the first electrode 14, and the extended portion 18 of the second electrode 15 is formed within the second electrode 15 as a part of the second electrode 15. The first electrode 14 and the second electrode 15 (the pair of electrodes) that constitute one organic EL element 13 do not come into contact with each other, and the extended portion 17 of the first electrode 14 and the extended portion 18 of the second electrode 15 do not overlap in a planar view. In the present embodiment, the extended portion 17 of the first electrode 14 extends in the width direction Y from the left-side end (hereinafter, also referred to as the left end) of a portion of the first electrode 14 facing the second electrode 15. The extended portion 18 of the second electrode 15 extends in the width direction Y from the right-side end (hereinafter, also referred to as the right end) of a portion of the second electrode 15 facing the first electrode 14. Thus, the extended part 17 of the first electrode 14 and the extended portion 18 of the second electrode 15 do not overlap in a planar view and are electrically insulated.

One electrode of the first and second electrodes 14 and 15 (the pair of electrodes) comprises a connecting portion. The connecting portion extends in the array direction X from the extended portion to the other electrode of the organic EL element neighboring in the array direction X so as to be connected to the other electrode. Not only the one electrode of the first and second electrodes 14 and 15 (the pair of electrodes) but also the other electrode of the first and second electrodes 14 and 15 (the pair of electrodes) may comprise such a connecting portion. In other words, the other electrode of the first and second electrodes 14 and 15 (the pair of electrodes) may also comprise the connecting portion that extends in the array direction X from the extended portion to one electrode of the organic EL element neighboring in the array direction X so as to be connected to the one electrode.

In the present embodiment, the first electrode 14 that corresponds to the one electrode of the first and second electrodes 14 and 15 (the pair of electrodes) comprises a connecting portion 19. In other words, the first electrode 14 comprises the connecting portion 19 that extends to the left from the extended portion 17 of the first electrode 14 to the extended portion 18 of the second electrode 15 (the other electrode) of the organic EL element on the left. Thus, the connecting portion 19 of the first electrode 14 overlaps in a planar view the extended portion 18 of the second electrode 15 (the other electrode) of the organic EL element on the left so as to be directly connected to the second electrode 15 (the other electrode) at the overlapping portion.

The extended portion that extends from the light-emitting layer 16 in the width direction Y in a planar view is provided in one or the other width direction Y, and is preferably provided in both of the width direction Y. In other words, the extended portions 17 and 18 preferably comprise first extended portions 17a and 18a that extend protruding from the light-emitting layer in one width direction in a planar view and second extended portions 17b and 18b that extend protruding from the light-emitting layer 16 in the other width direction Y in a planar view. With the extended portions 17 and 18 that extend from the light-emitting layer 16 in both of the width direction Y in a planar view, the first electrode 14 and the second electrode 15 each of the neighboring organic EL elements 13 are connected at the both ends in the width direction Y.

Among the organic EL elements 13 in series, each of the first electrode 14 of the leftmost organic EL element 13 and the second electrode of the rightmost organic EL element 13 is connected to a trace that is electrically connected to a power supply (not illustrated). Thus, power is supplied from the power supply to the organic EL elements 13 in series to allow each organic EL element to emit light.

Each organic EL element 13 is powered via the connecting portion. In the present embodiment, each organic EL element 13 comprises the extended portions 17 and 18 that extend from the light-emitting layer 16 in both of the width direction Y in a planar view and therefore is powered via the both ends in the width direction Y. The brightness per unit area of a portion of the organic EL element 13 decreases, due to a voltage drop, with distance from the site at which the organic EL element 13 is powered. In the present embodiment, the brightness per unit area of a portion of the organic EL element 13 decreases, due to the voltage drop, with distance in the width direction Y from the extended portions 17 and 18, namely it decreases as the portion is closer to the center in the width direction Y. However, since each organic EL element 13 is powered via the both ends in the width direction Y, impact of the voltage drop can be inhibited as compared to the case of an element that is powered via one end in the width direction Y, and therefore nonuniformity in brightness can be inhibited.

The structure of the supporting substrate 12 and the organic EL element 13 will be described below in more detail.

As described above, between the first and second electrodes 4 and 5, not only the light-emitting layer 6 but also the prescribed layer that is different from the light-emitting layer 6 may be provided. the layer provided between the cathode and the light-emitting layer may be an electron injection layer, an electron transport layer, or a hole block layer. When both of the electron injection layer and the electron transport layer are provided between the cathode and the light-emitting layer, a layer in contact with the cathode is called the electron injection layer, and a layer except for the electron injection layer is called the electron transport layer.

The electron injection layer has function to improve electron injection efficiency from the cathode. The electron transport layer has function to improve electron injection from a layer in contact with the surface on the cathode side. The hole block layer has function to block the transport of holes. When any one of the electron injection layer and the electron transport layer or both has function to block the transport of holes, the layer may also serve as the hole block layer.

The layer provided between the anode and the light-emitting layer may be a hole injection layer, a hole transport layer, or an electron block layer. When both of the hole injection layer and the hole transport layer are provided between the anode and the light-emitting layer, a layer in contact with the anode is called the hole injection layer, and a layer except for the hole injection layer is called the hole transport layer.

The hole injection layer has function to improve hole injection efficiency from the anode. The hole transport layer has function to improve hole injection from a layer in contact with the surface on the anode side. The electron block layer has function to block the transport of electrons. When any one of the hole injection layer and the hole transport layer or both has function to block the transport of electrons, the layer may also serve as the electron block layer.

The electron injection layer and the hole injection layer are also collectively called a charge injection layer, and the electron transport layer and the hole transport layer are also collectively called a charge transport layer.

Examples of Layer structures applicable to the organic EL element of the present embodiment are described below.
a) anode/light-emitting layer/cathode
b) anode/hole injection layer/light-emitting layer/cathode
c) anode/hole injection layer/light-emitting layer/electron injection layer/cathode
d) anode/hole injection layer/light-emitting layer/electron transport layer/cathode
e) anode/hole injection layer/light-emitting layer/electron transport layer/electron injection layer/cathode
f) anode/hole transport layer/light-emitting layer/cathode
g) anode/hole transport layer/light-emitting layer/electron injection layer/cathode
h) anode/hole transport layer/light-emitting layer/electron transport layer/cathode
i) anode/hole transport layer/light-emitting layer/electron transport layer/electron injection layer/cathode
j) anode/hole injection layer/hole transport layer/light-emitting layer/cathode
k) anode/hole injection layer/hole transport layer/light-emitting layer/electron injection layer/cathode
l) anode/hole injection layer/hole transport layer/light-emitting layer/electron transport layer/cathode m) anode/hole injection layer/hole transport layer/light-emitting layer/electron transport layer/electron injection layer/cathode
n) anode/light-emitting layer/electron injection layer/cathode
o) anode/light-emitting layer/electron transport layer/cathode
p) anode/light-emitting layer/electron transport layer/electron injection layer/cathode (The "forward slash (/)" indicates that the layers across a slash (/) are adjacently stacked. The same applies hereinafter.)

The organic EL element of the present embodiment may also comprise two or more light-emitting layers. The structure of the organic EL element having two light-emitting layers may be a layer structure of q) below where a stacked body placed between an anode and a cathode in any one of the layer structures of a) to p) described above is indicated by a "structural unit A". The layer structures of the two (structural units A) may be the same or different from each other.

q) anode/(structural unit A)/charge generation layer/(structural unit A)/cathode The structure of the organic EL element having three or more light-emitting layers may be a layer structure of r) below where "(structural unit A)/charge generation layer" is indicated by a "structural unit B".

r) anode/(structural unit B)x/(structural unit A)/cathode

In this structure, a symbol "x" is an integer of two or more, and (structural unit B)x is a stacked body in which the structural unit B is stacked x times. The layer structures of the plurality of "structural units B" may be the same or different from each other.

The charge generation layer is a layer generating holes and electrons when electric field is applied thereto. Examples of the charge generation layer include a thin film made of vanadium oxide, indium tin oxide (ITO), molybdenum oxide, or the like.

The organic EL element may be covered by a sealing member such as a sealing film or a sealing plate for hermetically sealing the element.

The layers of each of the organic EL elements having the layer structures of a) to r) exemplified above are stacked on the supporting substrate from the left in the order or are stacked on the supporting substrate from the right in the order. In the case where the examples of the layers of the layer structures of a) to r) described above are stacked on the supporting substrate from the left in the order, in other words, the layers are stacked on the supporting substrate in the order that begins with an anode, the first electrode 14 corresponds to the anode and the second electrode 15 corresponds to the cathode. Instead, in the case where the layers of the layer structures of a) to r) exemplified above are stacked on the supporting substrate from the right in the order, in other words, the layers are stacked on the supporting substrate in the order that begins with a cathode, the first electrode 14 corresponds to the cathode and the second electrode 15 corresponds to the anode.

The light-emitting device has a structure in which light emitted from the organic EL element is output through the supporting substrate or a structure in which the light is output not through the supporting substrate but through the opposite side to the supporting substrate. The organic EL element having the former structure is called a bottom emission type organic EL element, and the organic EL element having the latter structure is called a top emission type organic EL element.

The bottom emission type organic EL element in which light is output through the first electrode 14 employs an electrode having light transparency for the first electrode 14 and, usually for the second electrode, an electrode that reflects light. Instead, the top emission type organic EL element in which light is output through the second electrode employs an electrode having light transparency for the second electrode 15 and, usually for the first electrode 14, an electrode that reflects light.

<Supporting Substrate>

A supporting substrate that is not deformed at a step of manufacturing the organic EL element is suitably used. For example, glass, plastic, polymer films, silicon plates, and stacked bodies thereof are used. A driving substrate with a driving circuit driving an organic EL element previously formed thereon may be employed for the supporting substrate. When the bottom emission type organic EL element having a structure in which light is output through the supporting substrate is mounted on the supporting substrate, a substrate having light transparency is employed for the supporting substrate.

<Anode>

An organic EL element having a structure in which light emitted from the light-emitting layer is output through the anode employs an electrode having light transparency for the anode. A thin film of a metal oxide, a metal sulphide, a metal, or the like can be used for the electrode having light transparency, and an electrode with high electric conductivity and high light transparency is suitably used. Specifically, a thin film made of, for example, indium oxide, zinc oxide, tin oxide, ITO, indium zinc oxide (IZO), gold, platinum, silver, and copper is used, and among them, a thin film made of ITO, IZO, and tin oxide is suitably used. The method for manufacturing the anode may be a vacuum deposition method, a sputtering method, an ion plating method, or a plating method. An organic transparent conductive film such as polyaniline or derivatives thereof and polythiophene or derivatives thereof may also be used for the anode.

The film thickness of the anode is designed as appropriate in consideration of properties required, easiness of steps, and the like and is, for example, 10 nm to 10 µm, preferably, 20 nm to 1 µm, and more preferably, 50 nm to 500 nm.

<Hole Injection Layer>

Hole injection materials constituting the hole injection layer may be a metal oxide such as vanadium oxide, molybdenum oxide, ruthenium oxide, and aluminum oxide, phenylamine compounds, starburst-type amine compounds, phthalocyanine compounds, amorphous carbon, polyaniline, or polythiophene derivatives.

Examples of a method for forming a film of the hole injection layer include a method for forming the film from a solution comprising the hole injection material. For example, a solution comprising the hole injection material is applied to form a film by a prescribed coating method, and the film is solidified to form the hole injection layer.

The solvent used for forming a film from the solution may be: chlorine based solvents such as chloroform, methylene chloride, and dichloroethane; ether based solvents such as tetrahydrofuran; aromatic hydrocarbon based solvents such as toluene and xylene; ketone based solvents such as acetone and methyl ethyl ketone; ester based solvents such as ethyl acetate, butyl acetate, and ethyl cellosolve acetate; or water.

The film thickness of the hole injection layer is designed as appropriate in consideration of properties required, easiness of steps, and the like and is, for example, 1 nm to 1 µm, preferably, 2 nm to 500 nm, and more preferably, 5 nm to 200 nm.

<Hole Transport Layer>

Hole transport materials constituting the hole transport layer may be polyvinylcarbazole or derivatives thereof, polysilane or derivatives thereof, polysiloxane derivatives having an aromatic amine on a side chain or the main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly (p-phenylene vinylene) or derivatives thereof, or poly(2,5-thienylene vinylene) or derivatives thereof.

Among them, preferred hole transport materials are polymer hole transport materials such as polyvinylcarbazole or derivatives thereof, polysilane or derivatives thereof, polysiloxane derivatives having an aromatic amine compound group on a side chain or the main chain, polyaniline or derivatives thereof, polythiophene or derivatives thereof, polyarylamine or derivatives thereof, poly(p-phenylene vinylene) or derivatives thereof, and poly(2,5-thienylene vinylene) or derivatives thereof, and more preferably, polyvinylcarbazole or derivatives thereof, polysilane or derivatives thereof, and polysiloxane derivatives having an aromatic amine on a side chain or the main chain. When the hole transport material is a low molecular material, the material is preferably used by being dispersed in a polymer binder.

Examples of the method of forming a film of the hole transport layer include a method for forming the film from a solution comprising the hole transport material. For example, the hole transport layer can be formed by applying the solution comprising the hole transport material by a prescribed coating method to form a film and solidifying the film. In the case of using a low molecular hole transport material, a mixed solution of the low molecular hole transport material and a polymer binder may be used to form a film.

Examples of the solvent used for forming a film from the solution include: chlorine based solvents such as chloroform, methylene chloride, and dichloroethane; ether based solvents such as tetrahydrofuran; aromatic hydrocarbon based solvents such as toluene and xylene; ketone based solvents such as acetone and methyl ethyl ketone; and ester based solvents such as ethyl acetate, butyl acetate, and ethyl cellosolve acetate.

The polymer binder to be mixed is preferably a binder that does not extremely inhibit charge transportation, and a binder having weak absorption of visible light is suitably used. Examples of the polymer binder include polycarbonate, polyacrylate, polymethyl acrylate, polymethyl methacrylate, polystyrene, polyvinyl chloride, and polysiloxane.

The film thickness of the hole transport layer is designed as appropriate in consideration of properties required, easiness of steps, and the like and is, for example, 1 nm to 1 µm, preferably, 2 nm to 500 nm, and more preferably, 5 nm to 200 nm.

<Light-Emitting Layer>

The light-emitting layer is generally made of an organic substance that mainly emits any one of fluorescence and phosphorescence or both or made of the organic substance and a dopant assisting the organic substance. The dopant is added in order to, for example, improve the luminous efficiency and change the emission wavelength. The organic substance comprised in the light-emitting layer may be a low molecular compound or a polymer compound. The polymer compound generally has solubility in solvent that is higher than that of the low molecular compound, and therefore is suitably used in a coating method. For this reason, the light-emitting layer preferably comprises the polymer compound, and preferably comprises, as the polymer compound, a compound having a number average molecular weight of $10^3$ to $10^8$ in terms of polystyrene. Examples of light-emitting materials constituting the light-emitting layer include the following pigment materials, metal complex materials, polymer materials, and dopant materials.

(Pigment Materials)

Examples of the pigment materials include cyclopentamine derivatives, tetraphenyl butadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex Materials)

Examples of the metal complex materials include metal complexes having as a central metal, a rare-earth metal such as Tb, Eu, and Dy, Al, Zn, Be, Ir, Pt, or the like and having as a ligand, a structure of oxadiazole, thiadiazole, phenylpyridine, phenylbenzimidazole, quinoline, or the like, for example, metal complexes that emit light from the triplet excited state such as iridium complexes and platinum complexes, aluminum-quinolinol complexes, benzoquinolinol beryllium complexes, benzoxazolyl zinc complexes, benzothiazole zinc complexes, azomethyl zinc complexes, porphyrin zinc complexes, and phenanthroline europium complexes.

(Polymer Materials)

The polymer materials may be polyparaphenylene vinylene derivatives, polythiophene derivatives, polyparaphenylene derivatives, polysilane derivatives, polyacetylene derivatives, polyfluorene derivatives, polyvinylcarbazole derivatives, or polymerized materials of the pigment materials or the metal complex light-emitting materials described above.

Among the light-emitting materials described above, the material emitting blue light may be distyrylarylene derivatives, oxadiazole derivatives, and polymers of distyrylarylene derivatives and oxadiazole derivatives, polyvinylcarbazole derivatives, polyparaphenylene derivatives, or polyfluorene derivatives. Among them, polymer materials such as polyvinylcarbazole derivatives, polyparaphenylene derivatives, and polyfluorene derivatives are preferred.

The material emitting green light may be quinacridone derivatives, coumarin derivatives, polymers of quinacridone derivatives and coumarin derivatives, polyparaphenylene vinylene derivatives, or polyfluorene derivatives. Among them, polymer materials such as polyparaphenylene vinylene derivatives and polyfluorene derivatives are preferred.

The material emitting red light may be coumarin derivatives, thiophene ring compounds, polymers of coumarin derivatives and thiophene ring compounds, polyparaphenylene vinylene derivatives, polythiophene derivatives, or polyfluorene derivatives. Among them, polymer materials such as polyparaphenylene vinylene derivatives, polythiophene derivatives, and polyfluorene derivatives are preferred.

(Dopant Materials)

Examples of the dopant materials include perylene derivatives, coumarin derivatives, rubrene derivatives, quinacridone derivatives, squarylium derivatives, porphyrin derivatives, styryl pigments, tetracene derivatives, pyrazolone derivatives, decacyclene, and phenoxazon. The thickness of such a light-emitting layer is generally about 2 nm to 200 nm.

The light-emitting layer is formed by, for example, forming a film from a solution. For example, the light-emitting layer is formed by applying a solution comprising the light-emitting material by a prescribed coating method and solidifying the resultant. The solvent used for forming a film from the solution may be the same solvents as the solvent used for forming a film of the hole injection layer from the solution.

<Electron Transport Layer>

The electron transport materials constituting the electron transport layer may be oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or of derivatives of 8-hydroxyquinoline, polyquinoline or derivatives thereof, polyquinoxaline or derivatives thereof, or polyfluorene or derivatives thereof.

Examples of the method for forming a film of the electron transport layer include a vapor deposition method and a method for forming the film from the solution. When a film is formed from the solution, a polymer binder may also be used in combination.

The film thickness of the electron transport layer is designed as appropriate in consideration of properties required, easiness of steps, for example and is 1 nm to 1 µm, preferably, 2 nm to 500 nm, and more preferably, 5 nm to 200 nm, for example.

<Electron Injection Layer>

The material constituting the electron injection layer may be: an alkali metal; an alkaline-earth metal; alloys that comprise one or more types of an alkali metal and an alkaline-earth metal; an oxide, a halide, and carbonates of an alkali metal or an alkaline-earth metal; or mixtures of these substances. Examples of the alkali metal, or the oxide, the halide, and carbonates of the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline-earth metal or the oxide, the halide, and carbonates of the alkaline-earth metal include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may also be a stacked body in which two or more layers are stacked, and examples of the stacked body include LiF/Ca. The electron injection layer is formed by, for example, a vapor deposition method, a sputtering method, or a printing method. The film thickness of the electron injection layer is preferably about 1 nm to 1 µm.

<Cathode>

A preferred material of the cathode has a small work function, facilitates electron injection into the light-emitting layer, and has high electric conductivity. For the organic EL element extracting light from the anode, the material of the cathode preferably has high visible light reflectance because the cathode reflects the light output from the light-emitting layer to the anode. For example, an alkali metal, an alkaline-earth metal, a transition metal, and the group 13 metals in the periodic table can be used for the cathode. Examples of the materials of the cathode to be used include: a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more types of the metal; alloys of one or more types of the metal and one or more types of gold, silver, platinum, copper, manganese, titanium, cobalt, nickel, tungsten, and tin; and graphite or graphite intercalation compounds. Examples of the alloys include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys. For the cathode, a transparent conductive electrode made of a conductive metal oxide, a conductive organic substance, or the like can be used. Specific examples of the conductive metal oxide include indium oxide, zinc oxide, tin oxide, ITO, and IZO. Specific examples of the conductive organic substance include polyaniline or derivatives thereof and polythiophene or derivatives thereof. The cathode may be a stacked body in which two or more layers are stacked. The electron injection layer may be used as the cathode.

The film thickness of the cathode is designed as appropriate in consideration of properties required, easiness of steps, for example and is 10 nm to 10 µm, preferably, 20 nm to 1 µm, and more preferably, 50 nm to 500 nm, for example.

The method for manufacturing the cathode may be a vacuum deposition method, a sputtering method, or a lamination method by which a metal thin film is thermocompression bonded.

2) Method for Manufacturing the Light-Emitting Device

A method for manufacturing the light-emitting device of the present embodiment is a method for manufacturing a light-emitting device comprising a supporting substrate and a plurality of organic electroluminescent elements provided on the supporting substrate in a prescribed array direction to be connected in series, in which each organic electroluminescent element comprises a pair of electrodes and a light-emitting layer placed between the electrodes, the light-emitting layer extends in the prescribed array direction across the plurality of organic electroluminescent elements, each electrode out of the pair of electrodes comprises an extended portion that extends, as viewed from one thickness direction of the supporting substrate, protruding from the light-emitting layer in a width direction vertical to both of the thickness direction of the supporting substrate and the array direction, and one electrode out of the pair of electrodes further comprises a connecting portion that extends from the extended portion in the array direction to the other electrode of the organic electroluminescent element neighboring in the array direction so as to be connected to the other electrode. The manufacturing method comprises continuously applying an ink comprising a material of the light-emitting layer in the prescribed array direction across the organic electroluminescent elements and solidifying the applied film to form the light-emitting layer.

The method for manufacturing the light-emitting device will be described below referring to FIGS. 2 to 4.

First, the supporting substrate 12 is prepared. The supporting substrate 12 with a driving circuit (not illustrated) driving the organic EL element 13 previously formed thereon is preferably prepared in this step.

Figure 2:
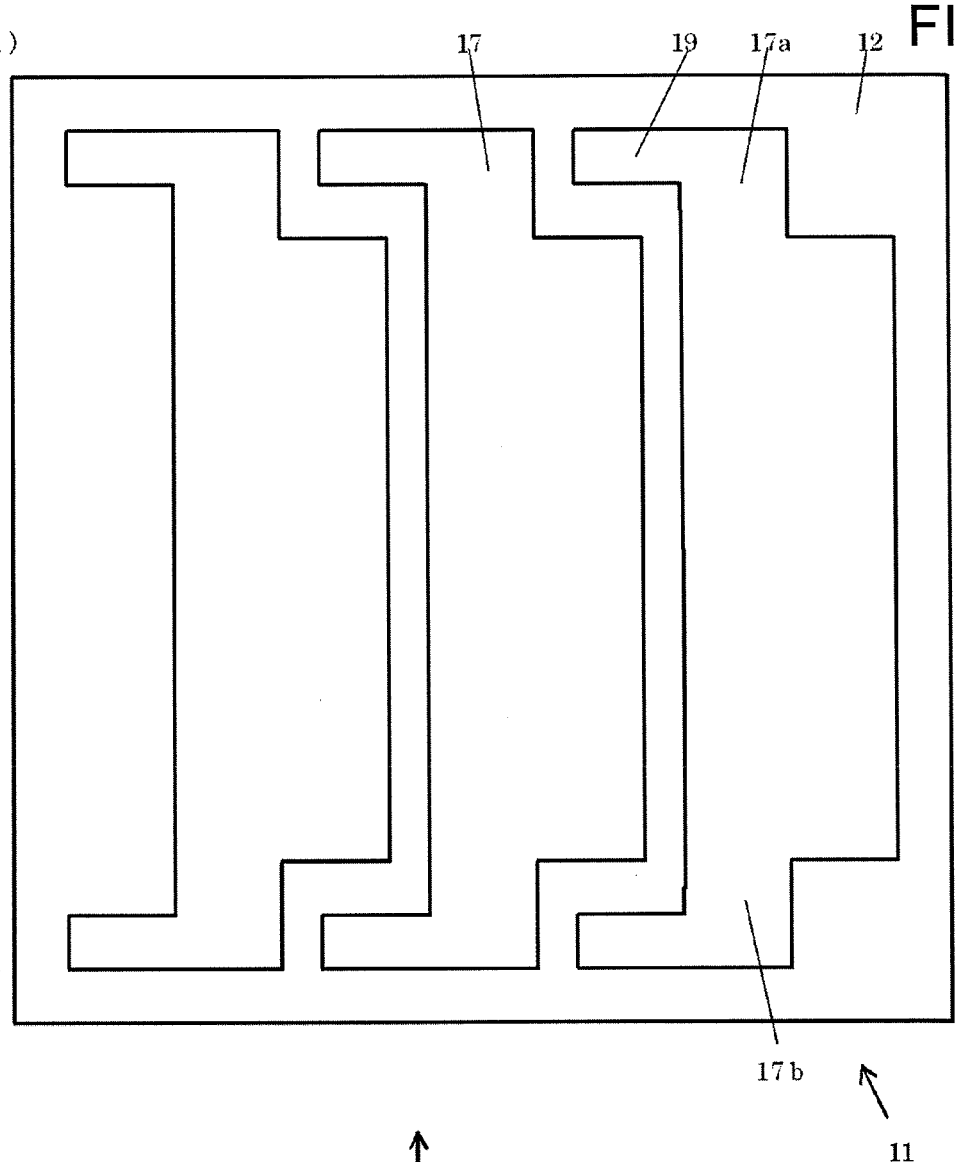
FIG. 2 is a schematic for illustrating a step of manufacturing the light-emitting device 11.
Figure 2:
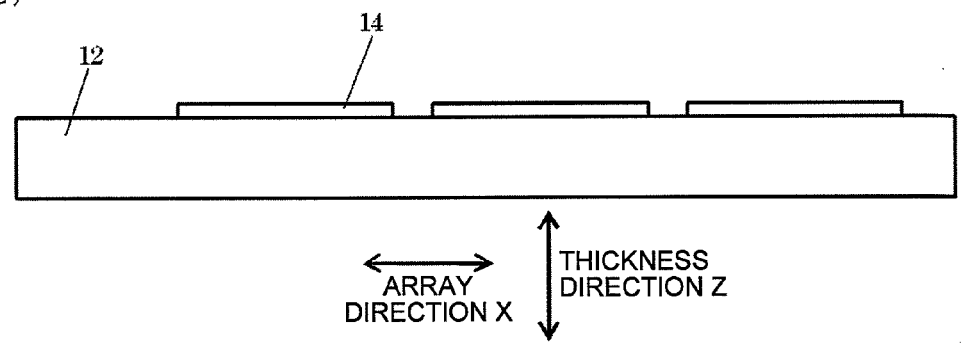

Next, a step of patterning the first electrode 14 on the supporting substrate 12 is performed (see FIG. 2). The step of patterning the first electrode 14 can be performed by, for example, forming a conductive film made of the material of an anode or a cathode described above on the supporting substrate 12 by a sputtering method or a vapor deposition method and then patterning the conductive film into a prescribed shape by photolithography. By a mask vapor deposition method or a similar method instead of photolithography, patterning of the first electrode 14 may be performed only on a prescribed area.

Figure 3:
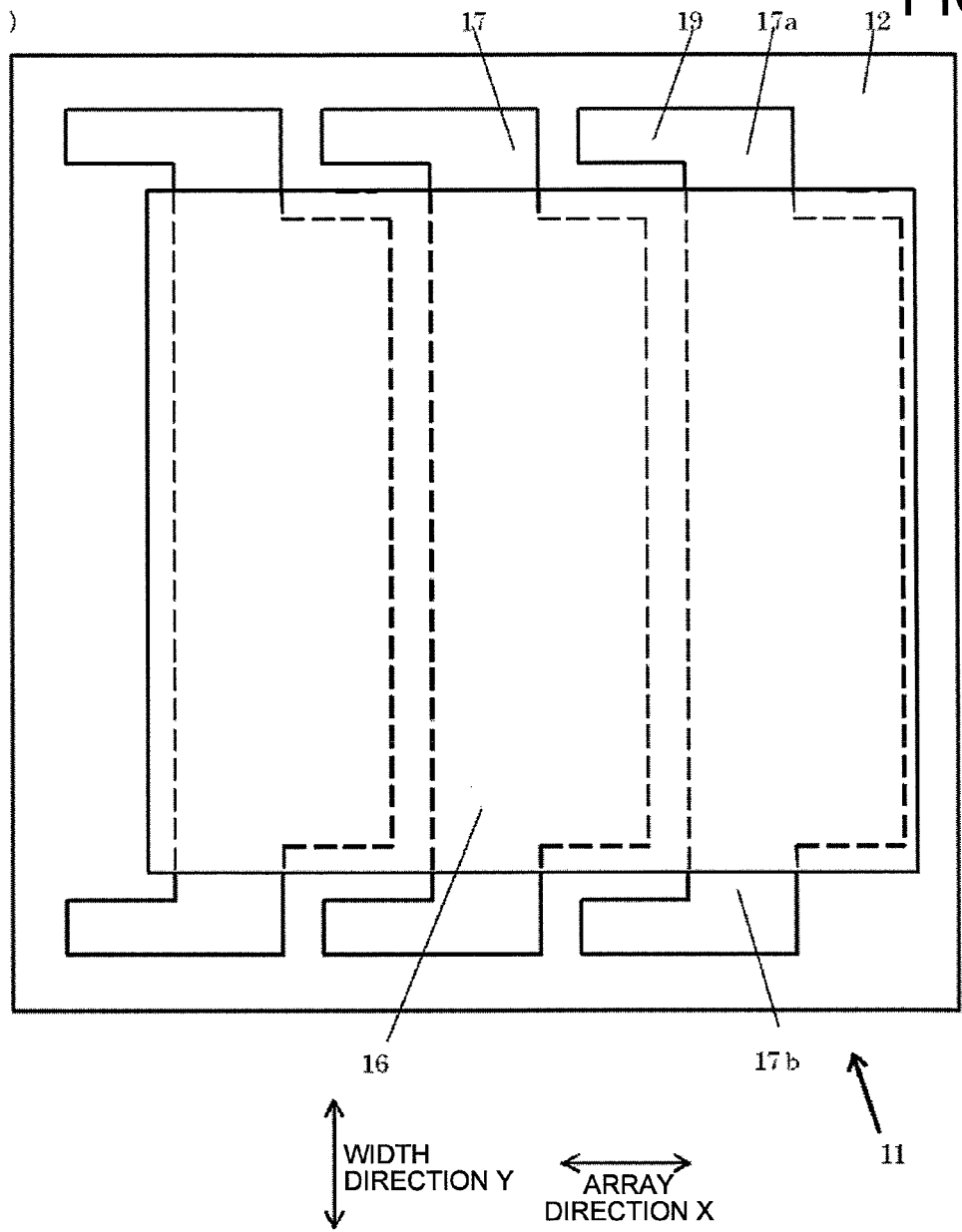
FIG. 3 is a schematic for illustrating the step of manufacturing the light-emitting device 11.
Figure 3:
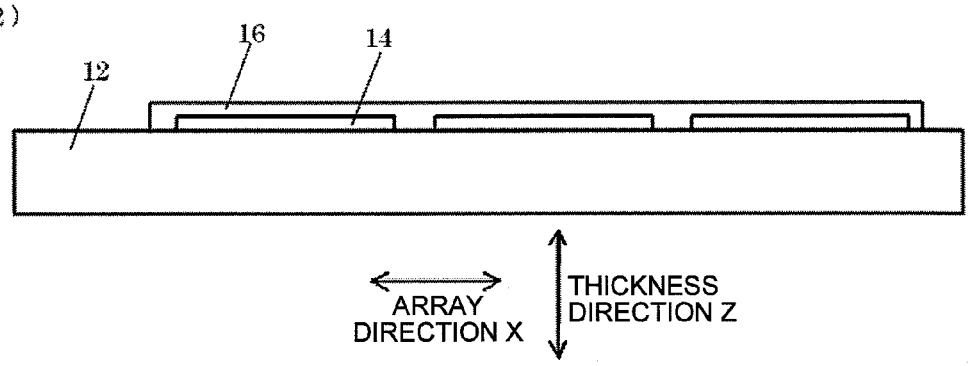

Next, the light-emitting layer 16 is formed (see FIG. 3). An ink comprising the material of the light-emitting layer described above is continuously applied in the array direction X across the organic EL elements 13 and the applied film is solidified to form the light-emitting layer.

As described above, between the first electrode 14 and the light-emitting layer 16, the prescribed layer that is different from the light-emitting layer 16 may be provided. In the case where the prescribed layer that is different from the light-emitting layer is formed by a coating method, the prescribed layer that is different from the light-emitting layer is preferably formed by the same method as the method for forming the light-emitting layer to be described below. In other words, the prescribed layer that is different from the light-emitting layer is preferably formed by continuously applying an ink comprising a material of the prescribed layer that is different from the light-emitting layer in the array direction X across the organic EL elements 13 and solidifying the applied film. In the case where the prescribed layer that is different from the light-emitting layer is formed by a dry process such as a vapor deposition method, the prescribed layer that is different from the light-emitting layer may be selectively formed only on the first electrode 14.

A method for applying the ink may be a CAP coating method, a slit coating method, a spray coating method, a printing method, an ink-jet printing method, or a nozzle printing method, and among these, a CAP coating method, a slit coating method, a spray coating method, and a printing method that allow efficient application on a large area are preferable.

A method for applying the ink comprising the material of the light-emitting layer by a CAP coating method, which is one of the coating methods, will be described below referring to FIG. 4. FIG. 4 is a schematic of a CAP Coater system 21 used to form the light-emitting layer. A method for manufacturing an organic EL element composed of "anode/light-emitting layer/cathode" will be described below as an example. In the case of the organic EL element having a structure in which an anode, a light-emitting layer, and a cathode are stacked on a supporting substrate in this order, a film of the light-emitting layer is formed on the substrate on which a film of the first electrode as an anode (hereinafter, also referred to as a subject (to be coated)) is formed. Hereinafter, in the present specification, "above" and "below" or "bottom" mean, "above in a perpendicular direction" and "below in a perpendicular direction" or "bottom in a perpendicular direction", respectively. In the following description of the CAP Coater system 21, the structures of a nozzle 23 and the like are described assuming an arrangement at the time of ink application.

The CAP Coater system 21 generally comprises a surface plate 22, the nozzle 23, and a tank 24. The table 22 holds the supporting substrate 12 as a subject 29 on which the first electrode 14 is formed. The method for holding the subject 29 may be vacuum adsorption. The table 22 holds the subject 29 by adsorption so that the surface to be coated of the subject 29, to which the ink is being applied faces below. The table 22 reciprocates in a horizontal direction with the help of a displacement driving means (not illustrated) such as an electric motor and a hydraulic device. The direction of the movement of the table 22 corresponds to an application direction that coincides with the array direction X in the present embodiment.

The nozzle 23 comprises a slit-shape outlet for discharging the ink. The lateral direction of the slit-shape outlet coincides with the array direction X and the longitudinal direction of the slit-shape outlet coincides with the width direction Y. In other words, the nozzle 23 comprises an opening that extends in the width direction Y. The width of the slit-shape outlet in the lateral direction is designed as appropriate depending on the properties of the ink, the thickness of a film to be applied, and the like. In a CAP coating method utilizing capillary action, the width of the slit-shape outlet in the lateral direction is usually about 0.01 mm to 1 mm. The width of the slit-shape outlet in the longitudinal direction is designed to substantially coincide with the width of the light-emitting layer in the width direction Y.

The bottom of the slit-shape outlet comprises a manifold that is filled with the ink. The nozzle 23 comprises a slit 25 communicating from the slit-shape outlet at the top of the nozzle 23 to the manifold. Into the manifold, the ink is supplied from the tank 24, and the ink supplied into the manifold proceeds through the slit 25 to be discharged through the slit-shape outlet.

The nozzle 23 is displaceably supported in a perpendicular direction and is displacement-driven by a displacement driving means such as an electric motor and a hydraulic device in the perpendicular direction.

The tank 24 contains an ink 27. The ink 27 in the tank 24 is the ink 27 to be applied on the subject 29 and, in the present embodiment, is a liquid comprising an organic material of the light-emitting layer. The manifold of the nozzle 23 and the tank 24 communicate via an ink supply tube 26. In other words, the ink 27 in the tank 24 is supplied through the ink supply tube 26 to the manifold, and proceeds through the slit 25 and the slit-shape outlet to be applied on the subject 29. The tank 24 is displaceably supported in the perpendicular direction and is displacement-driven by a displacement driving means such as an electric motor and a hydraulic device in the perpendicular direction. The tank 24 further comprises a liquid level sensor 28 for detecting the liquid level of the ink 27. The liquid level sensor 28 detects the height in the perpendicular direction of the liquid level of the ink 27. The liquid level sensor 28 is implemented by an optical sensor or a supersonic vibration sensor, for example.

The ink 27 to be supplied through the ink supply tube 26 from the tank 24 to the slit-shape outlet is extruded through the slit-shape outlet under pressure (static pressure) generated due to the height of the liquid level inside the tank 24 and force generated at the slit-shape outlet due to capillary action. The magnitude of static pressure that is to be applied on the liquid depends on the relative difference between the liquid level inside the tank 24 and the liquid level inside the nozzle 23.

The relative difference can be adjusted by adjusting the position of the tank 24 in the vertical direction, and therefore the amount of liquid to be extruded through the slit-shape outlet can be controlled by adjusting the position of the tank 24 in the vertical direction.

The CAP Coater system 21 further comprises a controller implemented by a microcomputer or the like. The controller controls the displacement driving means described above and the like. The controller controls the displacement driving means so as to control the positions of the nozzle 23 and the tank 24 in the perpendicular direction and the displacement of the surface plate 22 in the array direction X. While the ink 27 is being applied, the liquid level of the ink 27 inside the tank 24 decreases over time due to consumption of the ink 27. The controller controls the displacement driving means based on the detection result obtained by the liquid level sensor 28 so as to adjust the position of the tank 24 in the perpendicular direction, whereby the height of the ink 27 to be extruded through the slit-shape outlet can be controlled.

The operation of the above-described CAP Coater system 21 on ink application will be described.

(A Step of Applying)

While the ink that is being discharged through the nozzle 23 is in contact with the subject 29, the nozzle 23 and the subject 29 are moved against each other in a prescribed array direction X.

Specifically, the tank 24 is raised so that the liquid level of the ink inside the tank 24 is higher than the top of the nozzle 23 to allow the ink to be discharged through the slit-shape outlet, while the nozzle 23 is raised so that the top of the nozzle 23 becomes closer to the subject 29, whereby the ink being discharged through the slit-shape outlet comes into contact with the subject 29.

Figure 4:
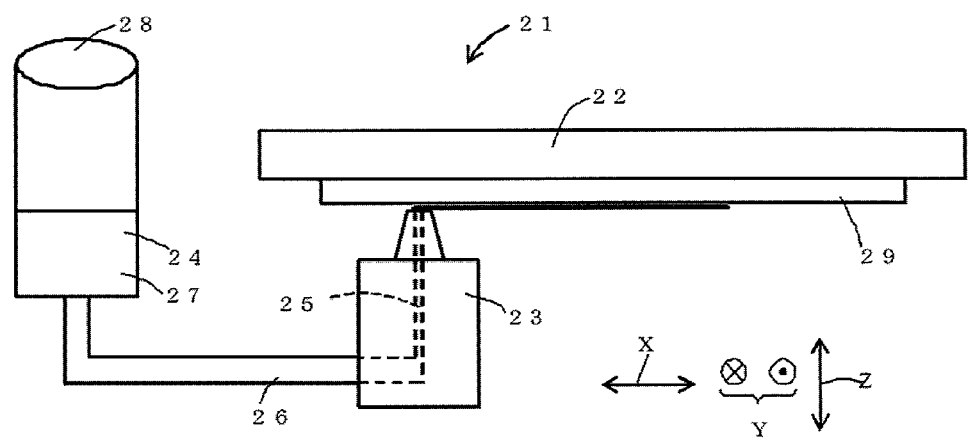
FIG. 4 is a schematic of a CAP Coater system 21.

Then, while maintaining the state that the ink is in contact with the subject 29, the table 22 holding the subject 29 is moved in the other array direction X (to the right in FIG. 4). After the table 22 holding the subject 29 is moved by a prescribed distance, the table 22 is caused to stop. Thus, a film having a substantially the same width as the width in a longitudinal direction of the slit-shape outlet is formed on the surface of the subject 29. In the present embodiment, displacement of the nozzle 23 and the table 22 is controlled so that the ink is applied on an area between the first extended portion 17a defined in one width direction Y of the first electrode 14 and the second extended portion 17b defined in the other width direction Y of the first electrode 14.

A clearance between the nozzle 23 and the subject 29 on ink application is designed to be about 0.05 mm to 0.3 mm, for example. Although the subject 29 is moved to apply the ink in the present embodiment, the nozzle 23 instead of the subject 29 may be moved in one array direction X (to the left in FIG. 4) or both of the nozzle 23 and the workpiece 29 may be moved.

Subsequently, the nozzle 23 is moved below so as to make the nozzle 23 and the subject 29 to be spaced from each other for solidifying the film. In the case where the light-emitting layer is formed using a polymerizable compound, the light-emitting layer can be solidified by light irradiation or heating. The film can also be solidified by removing a solvent contained in the ink, and in such a case, the film can be solidified by heat treatment or leaving the subject for a prescribed period of time. The light-emitting layer 16 is thus formed.

As described above, between the second electrode 15 and the light-emitting layer 16, the prescribed layer that is different from the light-emitting layer may be placed. When the prescribed layer that is different from the light-emitting layer is formed by a coating method, the prescribed layer that is different from the light-emitting layer is preferably formed on the light-emitting layer by the same method as the above-described method for forming the light-emitting layer. In other words, the prescribed layer that is different from the light-emitting layer is preferably formed by continuously applying the ink comprising the material of the prescribed layer that is different from the light-emitting layer in the array direction X across the organic EL elements 13 and solidifying the film. In the case where the prescribed layer that is different from the light-emitting layer is formed by a dry process such as a vapor deposition method, the prescribed layer that is different from the light-emitting layer may be selectively formed only on the first electrode 14 in a planar view.

Next, the second electrode 15 is formed. Patterning the second electrode 15 can be performed on the light-emitting layer 16 by, for example, forming a film made of the material of an anode or a cathode described above selectively only on the area on which the second electrode 15 is to be provided by a mask vapor deposition method.

In the light-emitting device 11 above described, the first electrode 14 and the second electrode 15 each of the neighboring organic EL elements 13 are connected at a region protruding, in a planar view, in the width direction Y from a region on which the light-emitting layer 16 is formed, and therefore the neighboring organic EL elements 13 are connected in series. Thus, the first electrode 14 and the second electrode 15 each of the neighboring organic EL elements 13 are not required to be connected at a region between the organic EL elements 13. For this reason, the light-emitting layer and the like may be formed at the region between the neighboring organic EL elements 13 and therefore, in the case of forming the light-emitting layer by a coating method, a step of removing the light-emitting layer to be formed at the region between neighboring organic EL elements 13 can be omitted. Therefore, even by a coating method such as a CAP coating method that is relatively less capable of coating a fine pattern, the organic EL elements 13 in series can be easily formed.

In the case of forming the light-emitting layer by a coating method, the step of removing the light-emitting layer to be formed at the region between neighboring organic EL elements 13 can be omitted, and therefore limitation of a light-emitting region resulting from stripping the light-emitting layer off does not occur. Because of this, the distance between the neighboring organic EL elements can be as small as possible and the light-emitting area can be enlarged.

Figure 5:
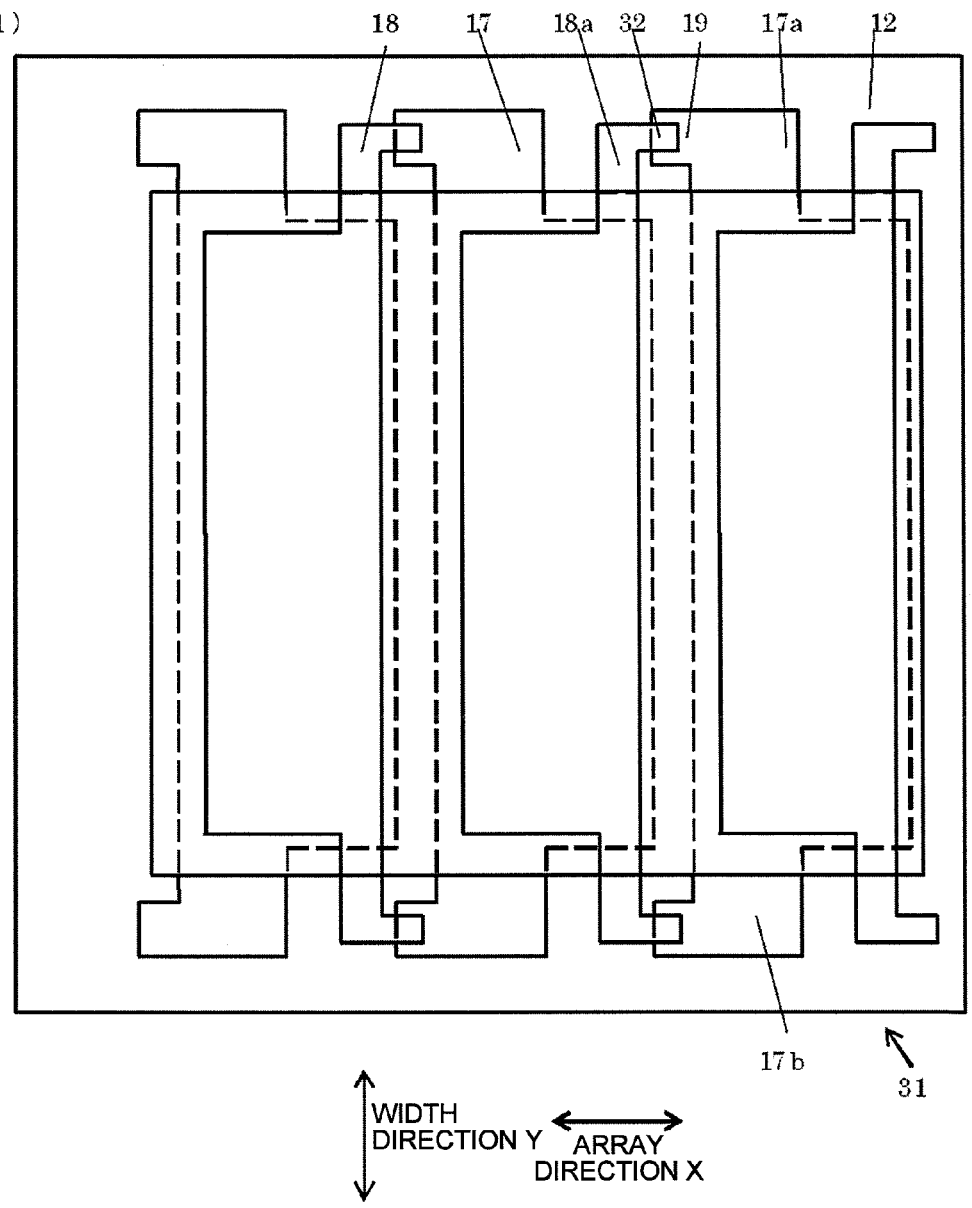
FIG. 5 is a schematic of a light-emitting device 31 of a second embodiment.
Figure 5:
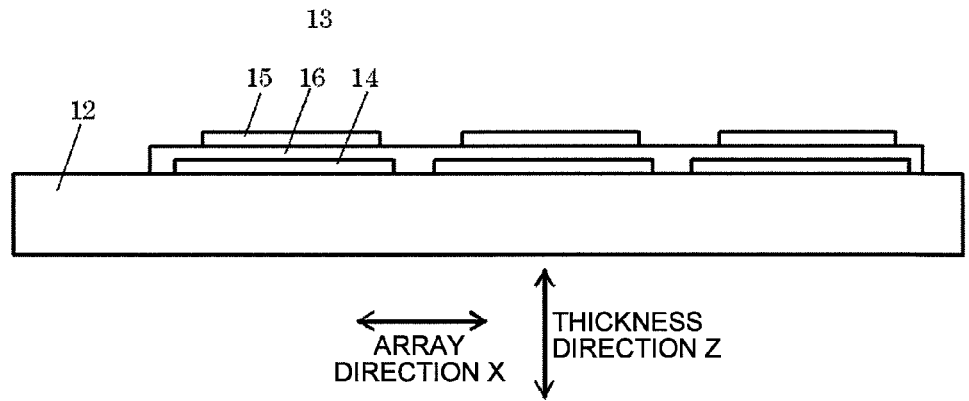

FIG. 5 is a schematic of a light-emitting device 31 of a second embodiment of the present invention. The only differences between the light-emitting device 31 of the present embodiment and the light-emitting device 11 of the first embodiment described above are the shapes of the first electrode 14 and the second electrode 15. Therefore, description will be made only on the first electrode 14 and the second electrode 15, while the portions that correspond to the first embodiment are provided with the same reference numerals as in the first embodiment and overlapping description is omitted.

In the present embodiment, not only the first electrode 14 but also the second electrode 15 may comprise a connecting portion 32. In other words, the second electrode 15 comprises the connecting portion 32 that extends from the extended portion in the array direction X to the first electrode 14 of the organic EL element neighboring in the array direction X so as to be connected to the first electrode 15.

Therefore, as for the pair of organic EL elements 13 neighboring in the array direction X, the connecting portion 19 extends to the left from the extended portion 17 of the first electrode 14 of the organic EL element 13 on the right, while the connecting portion 32 extends to the right from the extended portion 18 of the second electrode 15 of the organic EL element 13 on the left. Thus, the connecting portion 19 of the first electrode 14 overlaps the connecting portion 32 of the second electrode 15, so that the first electrode 14 and the second electrode 15 each of the neighboring organic EL elements 13 are connected.

Figure 6:
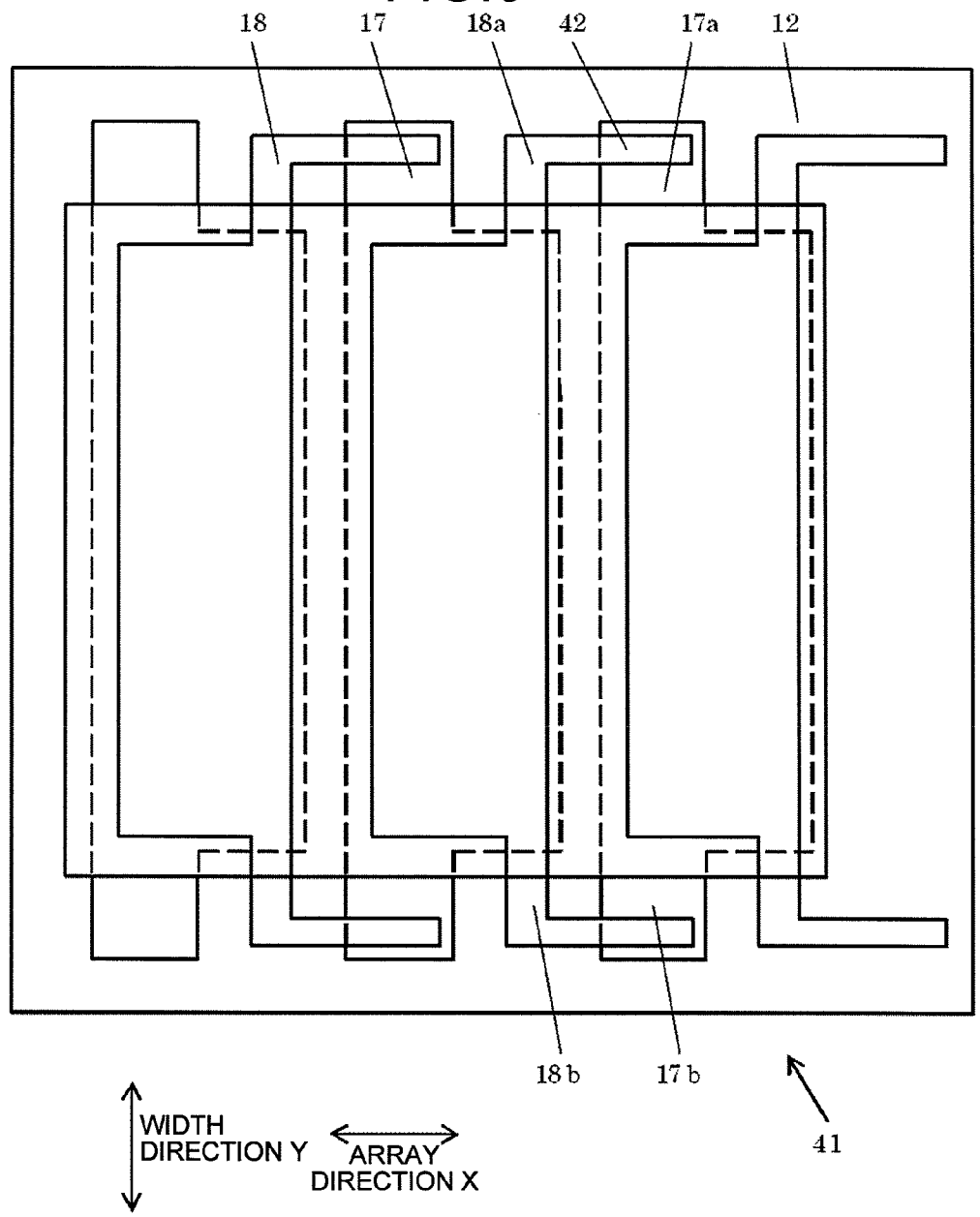
FIG. 6 is a schematic of a light-emitting device 41 of a third embodiment.
Figure 6:
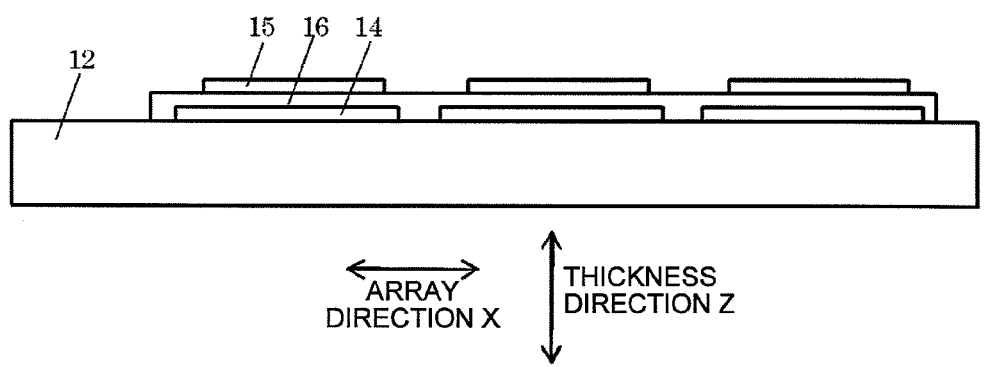

FIG. 6 is a schematic of a light-emitting device 41 of a third embodiment of the present invention. The only differences between the light-emitting device 41 of the present embodiment and the light-emitting device 11 of the first embodiment described above are the shapes of the first electrode 14 and the second electrode 15. Therefore, description will be made only on the first electrode 14 and the second electrode 15, while the portions that correspond to the first embodiment are provided with the same reference numerals as in the first embodiment and overlapping description is omitted.

In the present embodiment, the first electrode 14 comprises no connecting portion 19 and the second electrode 15 comprises a connecting portion 42. In other words, the second electrode 15 comprises the connecting portion 42 that extends from the extended portion in the array direction X to the first electrode 14 of the organic EL element neighboring in the array direction X so as to be connected to the first electrode 15.

In the light-emitting device 11 of the first embodiment illustrated in FIG. 1, only the first electrode 14 comprises the connecting portion 19, while in the light-emitting device 41 of the third embodiment illustrated in FIG. 6, only the second electrode 15 comprises the connecting portion 42. In the case where only one electrode of the first and second electrodes 14 and 15 comprises the connecting portion, which electrode is to comprise the connecting portion may be selected as appropriate depending on the design and, however, only one electrode of the first and second electrodes 14 and 15 (the pair of electrodes) that has lower sheet resistance preferably comprises the connecting portion. In other words, when the sheet resistance of the first electrode 14 is lower than the sheet resistance of the second electrode 15, only the first electrode 14 preferably comprises the connecting portion 19 as in the light-emitting device 11 of the first embodiment illustrated in FIG. 1. In contrast, when the sheet resistance of the second electrode 15 is lower than the sheet resistance of the first electrode 14, only the second electrode 15 preferably comprises the connecting portion 42 as in the light-emitting device 41 of the third embodiment illustrated in FIG. 6.

One electrode of the first and second electrodes 14 and 15 is formed of a component having light transparency so as to output light emitted from the light-emitting layer 16. The component having light transparency generally has higher sheet resistance than that of a conductive component having no light transparency. Because of this, the one electrode of the first and second electrodes 14 and 15 that has light transparency usually has higher sheet resistance. Therefore, in ordinary cases, only the other electrode that is not the one electrode having light transparency preferably comprises the connecting portion.

On operation of the light-emitting device, a voltage drop also occurs at the connecting portion formed of a conductor. However, by providing the connecting portion only on the electrode that is formed of a component having lower sheet resistance, the voltage drop to occur at the connecting portion can be inhibited, which in turn can decrease power consumption.

Figure 7:
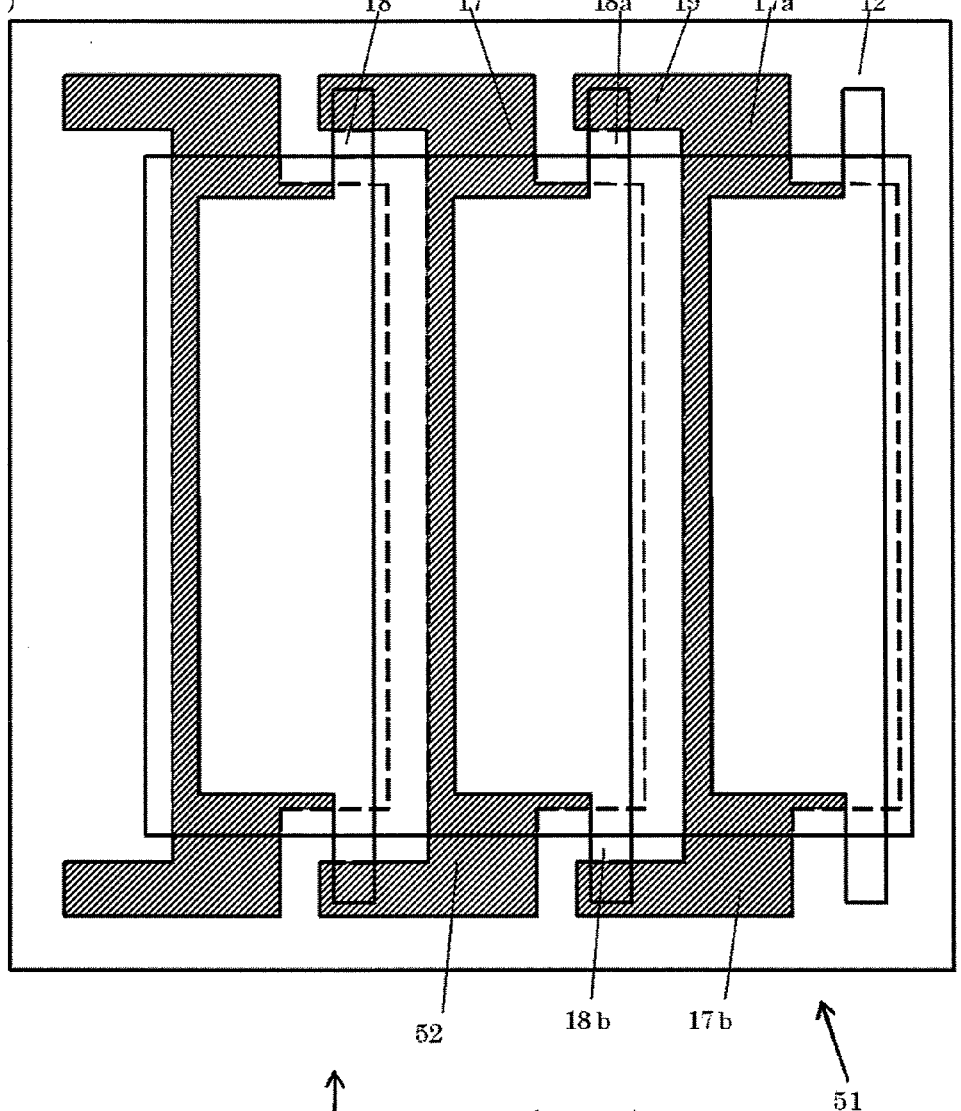
FIG. 7 is a schematic of a light-emitting device 51 of a forth embodiment.
Figure 7:
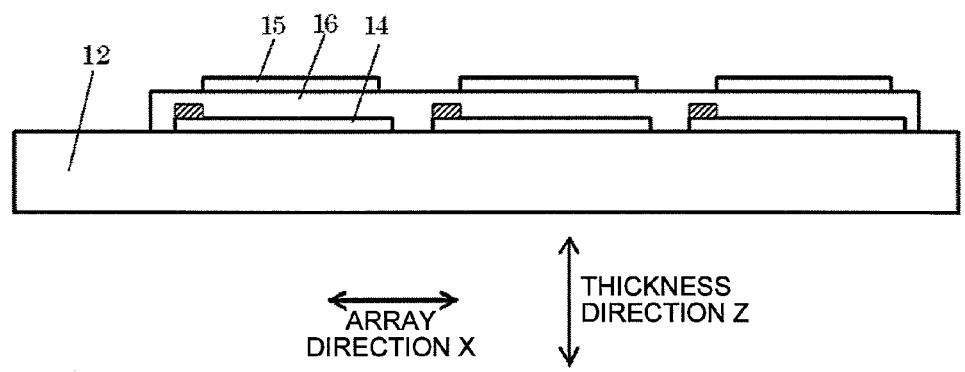

FIG. 7 is a schematic of a light-emitting device 51 of a forth embodiment of the present invention. The light-emitting device 51 of the present embodiment further comprises an auxiliary electrode in contact with the electrode. The only difference between the light-emitting device 51 of the present embodiment and the light-emitting device of each embodiment described above is the presence or absence of the auxiliary electrode. Therefore, description will be made only on the auxiliary electrode, while the portions that correspond to the each embodiment described above are provided with the same reference numerals and overlapping description is omitted. In FIG. 7, a region of the auxiliary electrode is hatched.

The auxiliary electrode is provided in contact with at least one of the first electrode 14 and the second electrode 15 (the pair of electrodes). In the case where the auxiliary electrode is provided in contact with the first electrode 14 and the second electrode 15, two auxiliary electrodes, one in contact with the first electrode 14 and the other in contact with the second electrode, are provided.

The auxiliary electrode is formed of a component that has sheet resistance that is lower than that of the electrode in contact with the auxiliary electrode. An auxiliary electrode 52 is preferably provided in contact with the electrode of the first electrode 14 and the second electrode 15 (the pair of electrodes) that has higher sheet resistance. As described above, one electrode of the first and second electrodes 14 and 15 is formed of a component having light transparency so as to output light emitted from the light-emitting layer 16. The electrode having light transparency usually has higher sheet resistance than that of the other electrode. Because of this, in ordinary cases, the one electrode of the first and second electrodes 14 and 15 that has light transparency preferably comprises the auxiliary electrode 52 in contact therewith. In the light-emitting device 51 of the present embodiment illustrated in FIG. 7, the auxiliary electrode 52 is provided in contact with the first electrode 14 that serves as the electrode having light transparency.

The auxiliary electrode 52 has lower sheet resistance than that of the electrode with which the auxiliary electrode 52 is in contact, and therefore is usually opaque. In the case where the electrode through which light passes is provided with the opaque auxiliary electrode 52 in contact therewith, the auxiliary electrode 52 may block the light. Therefore, the auxiliary electrode 52 is preferably provided, in a planar view, at a region at which the light-emitting layer 16 emits no light in principle.

The light-emitting layer 16 can emit light, in principle, at a region (hereinafter, also referred to as a facing region) at which the first electrode 14 and the second electrode 15 face each other in a planar view. Therefore, the region at which no light is emitted in principle corresponds to a region other than the facing region of the first electrode 14 and the second electrode 15 in a planar view. For this reason, the auxiliary electrode 52 is preferably provided at the region other than the facing region of the first electrode 14 and the second electrode 15 in a planar view.

The auxiliary electrode may be formed at the facing region of the first electrode 14 and the second electrode 15 in a planar view in consideration of a light-emitting amount, the voltage drop, and the like. For example, the auxiliary electrode may be formed at the facing region and the periphery of the facing region. A linear auxiliary electrode may be formed, for example, in a grid or in stripes, at the facing region in a planar view, and the auxiliary electrode formed at the facing region and the auxiliary electrode formed at the periphery of the facing region may be connected.

As the material of the auxiliary electrode, a material with high electric conductivity is preferably used, and the materials may be Al, Ag, Cu, Au, or W. Alloys such as Al—Nd and Ag—Pd—Cu may be used in the auxiliary electrode. The thickness of the auxiliary electrode is designed as appropriate depending on sheet resistance required and the like and is, for example, 50 nm to 2000 nm. The auxiliary electrode may be a monolayer or a stacked body in which a plurality of layers are stacked. In the case where adhesion to the supporting substrate 12 (such as a glass substrate) or the first electrode 14 (such as an ITO thin film) is desired to be improved, the case where protection of the metal surface from oxygen and moisture is desired, or other cases, a layer having a certain function may be stacked on a thin film made of the material with high electric conductivity. For example, a stacked body in which a thin film made of the material with high electric conductivity is interposed between thin films made of Mo, Mo—Nb, Cr, and the like can be used as the auxiliary electrode.

The embodiments described above provide light-emitting devices in which a plurality of organic EL elements are connected to constitute a series connection and, however, the present invention can be suitably applied to a light-emitting device in which a plurality of organic EL elements are connected to constitute a plurality of series connections. The present invention can also be suitably applied to a light-emitting device that is formed of a combination of a series connection and a parallel connection.

Figure 8:
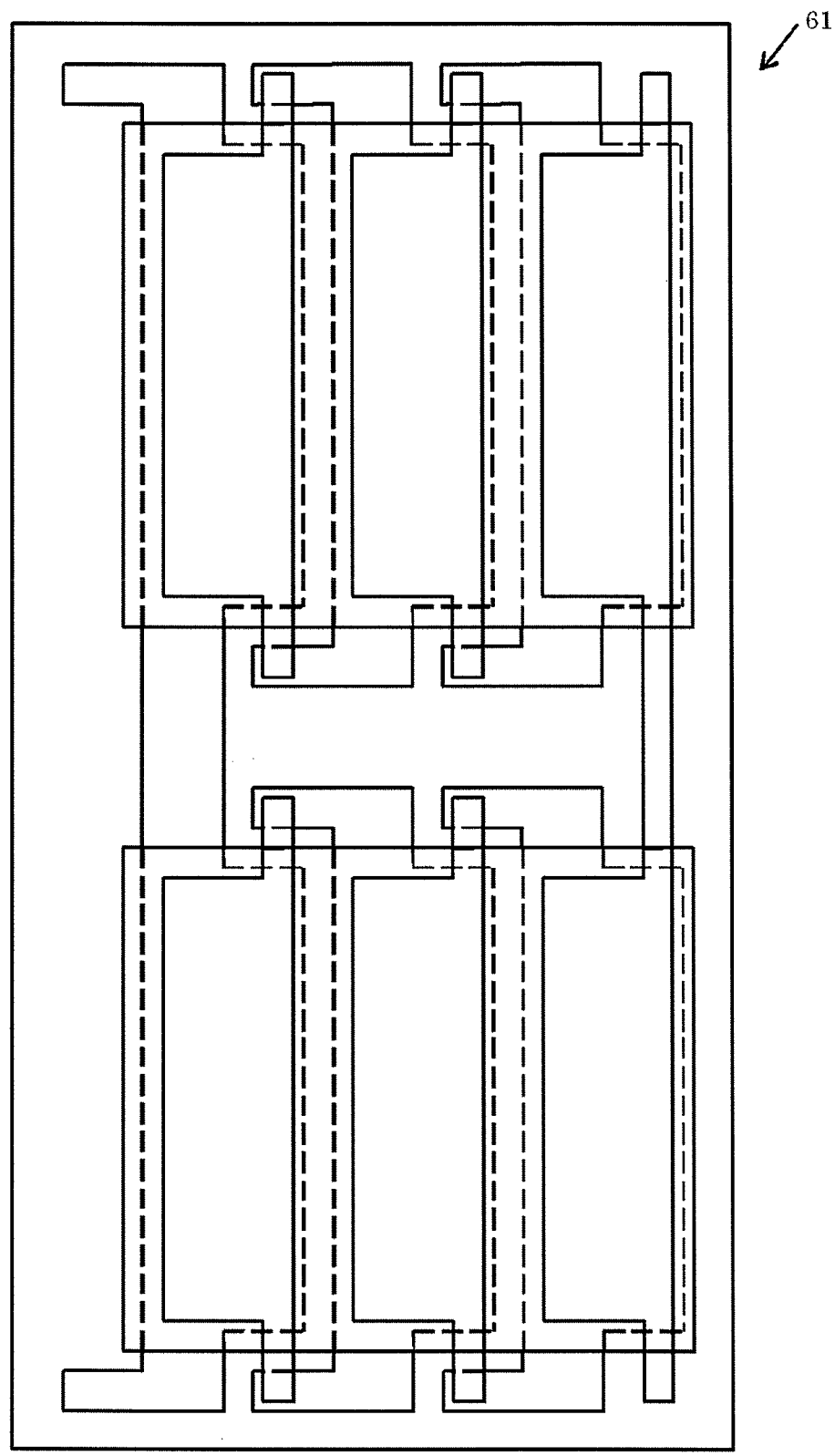
FIG. 8 is a view of a light-emitting device 61 of a fifth embodiment.
Figure 9:
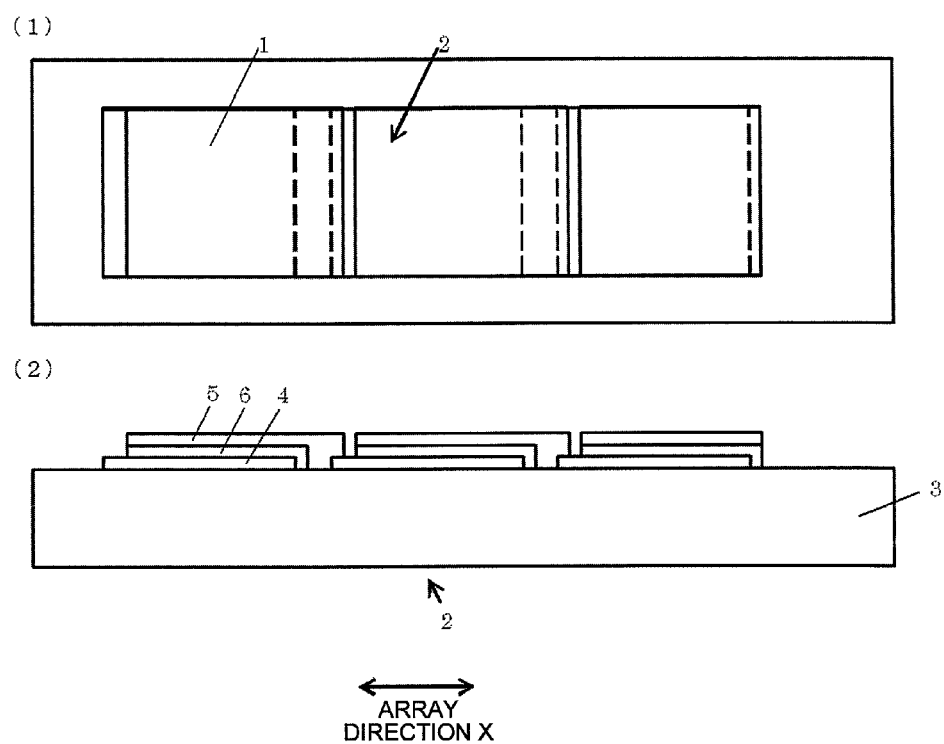
FIG. 9 is a schematic of the light-emitting device 2 in which the organic EL elements 1 are connected in series.
Figure 10:
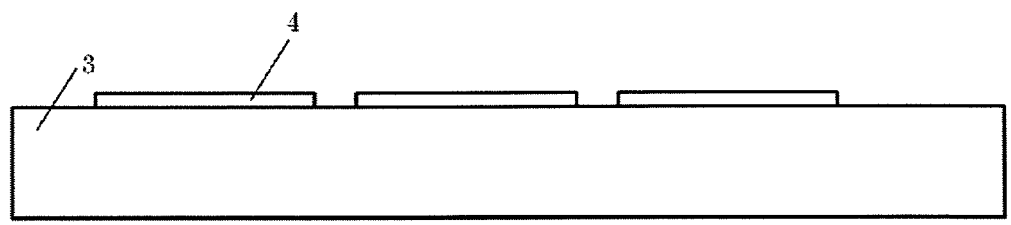
FIG. 10 is a schematic for illustrating a step of manufacturing the light-emitting device 2.
Figure 10:
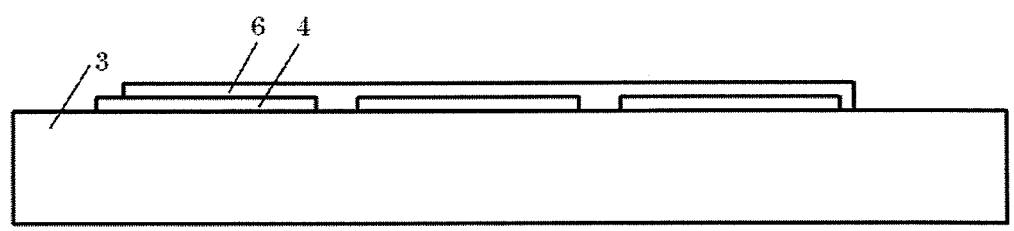
Figure 10:
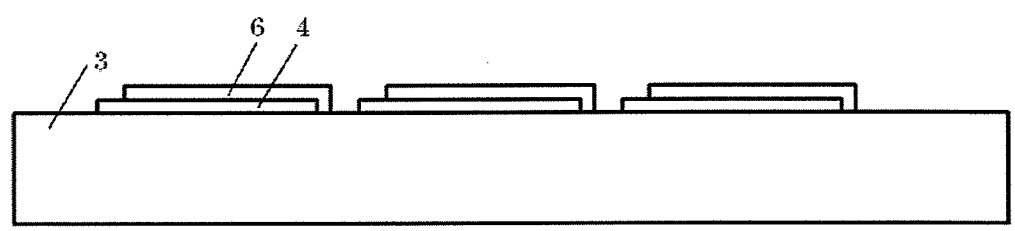
Figure 10:
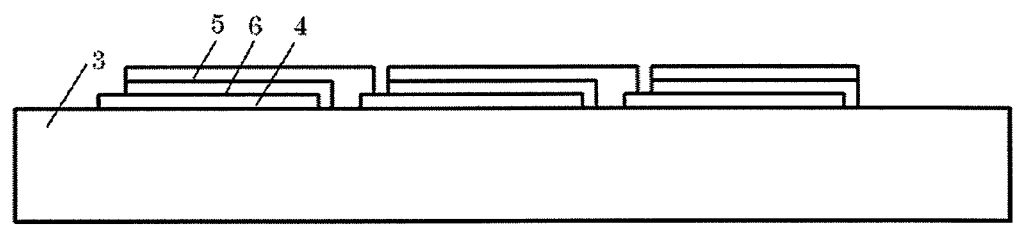

FIG. 8 is a view of a light-emitting device 61 of a fifth embodiment of the present invention. The light-emitting device 61 of the present embodiment is a light-emitting device in which two series connections are connected in parallel. Each series connection comprises three organic EL elements in series. These two series connections are connected in parallel with both of one ends being electrically connected and both of the other ends being electrically connected.

In the light-emitting device in which a plurality of organic EL elements are connected to constitute a series connection, voltage of a driving source driving the organic EL elements increases as the number of the elements increases. However, when a parallel connection is used in combination, supply voltage required for the driving source can be moderately controlled.

EXAMPLES

Example 1

A light-emitting device having substantially the same structure as that illustrated in FIG. 8 was formed. In Example 1, two series connections each composed of eight organic EL elements were connected in parallel. In other words, a light-emitting device comprising 16 organic EL elements of 8×2 was formed.

The structure of the organic EL element is as follows.

Supporting substrate/anode/hole injection layer/interlayer/light-emitting layer/electron injection layer/cathode An ITO thin film with a film thickness of 150 nm was formed on a supporting substrate by a sputtering method.

Patterning of the ITO thin film into a prescribed shape was performed by photolithography to form an anode.

On the supporting substrate on which the anode was formed, a hole injection layer, an interlayer, and a light-emitting layer were sequentially formed by a coating method. The hole injection layer, the interlayer, and the light-emitting layer were formed by a spin coating method using an ink. A film was formed even on an unneeded area by the spin coating method, and therefore the film applied on the unneeded area was wiped off using a waste impregnated with a solvent to which the ink was soluble. After the wiping-off step, the hole injection layer, the interlayer, and the light-emitting layer were formed across the plurality of organic EL elements. The shapes of the hole injection layer, the interlayer, and the light-emitting layer were designed to be approximately rectangular of 74.0 mm×71.2 mm in a planar view. The film thicknesses of the hole injection layer, the interlayer, and the light-emitting layer were 6 nm, 2 nm, and 6 nm, respectively.

Next, Ba was deposited 5 nm by a vapor deposition method as an electron injection layer, and Al was then deposited 100 nm by a vapor deposition method as a cathode.

The widths in a lateral direction of five organic EL elements of the eight organic EL elements in series were designed to be relatively shorter, and the widths in the lateral direction of the other three organic EL elements were designed to be relatively longer. Specifically, the light-emitting regions of the five organic EL elements were designed to be approximately rectangular of 66.0 mm×10.4 mm in a planar view, and the light-emitting regions of the three organic EL elements were designed to be approximately rectangular of 66.0 mm×20.0 mm in a planar view.

When a voltage of 50 volts was applied to the light-emitting device, the organic EL element emitted light.

In Example 1, use of a spin coating method in which pattern coating is difficult to achieve required a step of wiping-off the film. However, in the case where the CAP Coater system 21 illustrated in FIG. 4 is used for application by a prescribed application width to form a film, the step of wiping-off the film can be omitted.

Example 2

In Example 2, a light-emitting device was formed in the same manner as in Example 1 except that an auxiliary electrode was formed on an anode. The structure in Example 2 was the same as the structure in Example 1 except that the auxiliary electrode was formed, and therefore description will be made only on the auxiliary electrode.

The auxiliary electrode was formed on the anode made of an ITO thin film. The auxiliary electrode was formed on the anode at a region other than where the anode and a cathode faced each other. By a vapor deposition method, Mo, Al—Nd, and Mo were deposited 50 nm, 800 nm, and 50 nm, respectively, in the order from the side of the ITO thin film. In other words, the auxiliary electrode with a three layer structure (Mo/Al—Nd/Mo) was formed on the ITO thin film.

The sheet resistance of the conductor made of the ITO thin film alone was 10Ω/, and the sheet resistance of the conductor made of the ITO thin film stacked with the auxiliary electrode was 0.38Ω/. Thus, it was confirmed that sheet resistance can be decreased by stacking the auxiliary electrode.

When a voltage of 50 volts was applied, the organic EL element emitted light.

Industrial Applicability

According to the present invention, the light-emitting layer extending in the prescribed array direction across the plurality of organic EL elements makes it possible to form the light-emitting layer by a coating method that can continuously apply the ink in the array direction, and to omit the step of wiping the ink off even in the case of using such a coating method. Since one electrode and the other electrode each of the neighboring organic EL elements are connected at a region that is, as viewed from one thickness direction of the supporting substrate, different from the region on which the light-emitting layer is formed, a series connection of the organic EL elements can be formed even in the case of forming the light-emitting layer that extends in the array direction across the organic EL elements. In addition, limitation of the light-emitting region resulting from stripping the light-emitting layer that is formed between the electrodes and on the electrodes does not occur, and therefore the distance between the neighboring organic EL elements can be as small as possible and the light-emitting area can be enlarged.

The invention claimed is:
1. A light-emitting device, comprising:
a supporting substrate; and
a plurality of organic electroluminescent elements provided on the supporting substrate in a prescribed array direction to be connected in series, wherein
each of the organic electroluminescent elements comprises a pair of electrodes and a light-emitting layer placed between the electrodes,
the light-emitting layer extends in the prescribed array direction across the plurality of organic electroluminescent elements,
each electrode out of the pair of electrodes comprises an extended portion that extends, as viewed from one thickness direction of the supporting substrate, protruding from the light-emitting layer in a width direction vertical to both of the thickness direction of the supporting substrate and the array direction, and one electrode out of the pair of electrodes further comprises a connecting portion that extends from the extended portion in the array direction to the other electrode of the organic electroluminescent element neighboring in the array direction so as to be connected to the other electrode.

2. The light-emitting device according to claim 1, further comprising an auxiliary electrode in contact with the electrode, wherein the auxiliary electrode has sheet resistance that is lower than that of the electrode in contact with the auxiliary electrode.

3. The light-emitting device according to claim 2, wherein the auxiliary electrode is provided in contact with one electrode out of the pair of electrodes that has higher sheet resistance.

4. The light-emitting device according to claim 1, wherein only one electrode out of the pair of electrodes that has lower sheet resistance comprises the connecting portion.

5. The light-emitting device according to claim 1, wherein the extended portion, as viewed from one thickness direction, comprises a first extended portion that extends protruding from the light-emitting layer in one width direction and a second extended portion that extends protruding from the light-emitting layer in the other width direction.

6. A method for manufacturing a light-emitting device, wherein the light-emitting device comprises a supporting substrate and a plurality of organic electroluminescent elements provided on the supporting substrate in a prescribed array direction to be connected in series, each of the organic electroluminescent elements comprises a pair of electrodes and a light-emitting layer placed between the electrodes, the light-emitting layer extends in the prescribed array direction across the plurality of organic electroluminescent elements, each electrode out of the pair of electrodes comprises an extended portion that extends, as viewed from one thickness direction of the supporting substrate, protruding from the light-emitting layer in a width direction vertical to both of the thickness direction of the supporting substrate and the array direction, and one electrode out of the pair of electrodes further comprises a connecting portion that extends from the extended portion in the array direction to the other electrode of the organic electroluminescent element neighboring in the array direction so as to be connected to the other electrode, the method comprising:

continuously applying an ink comprising a material of the light-emitting layer in the prescribed array direction across the organic electroluminescent elements and solidifying the applied film thereby forming the light-emitting layer.

7. The method for manufacturing a light-emitting device according to claim 6, wherein a method of ink application is a CAP coating method, a slit coating method, a spray coating method, or a printing method.

* * * * *